United States Patent
Sundararajan et al.

(10) Patent No.: US 11,373,085 B2
(45) Date of Patent: Jun. 28, 2022

(54) IOT BASED FIRE PREDICTION

(71) Applicant: International Business Machines Corporation, Armonk, NY (US)

(72) Inventors: Mukundan Sundararajan, Bangalore (IN); Jignesh K. Karia, Thane (IN); Shilpa Shetty, Marathahalli (IN)

(73) Assignee: International Business Machines Corporation, Armonk, NY (US)

( * ) Notice: Subject to any disclaimer, the term of this patent is extended or adjusted under 35 U.S.C. 154(b) by 395 days.

(21) Appl. No.: 16/787,142

(22) Filed: Feb. 11, 2020

(65) Prior Publication Data

US 2021/0248441 A1 Aug. 12, 2021

(51) Int. Cl.
| | |
|---|---|
| G06N 3/04 | (2006.01) |
| G06F 30/18 | (2020.01) |
| G08B 21/18 | (2006.01) |
| G01K 13/00 | (2021.01) |
| G01R 19/00 | (2006.01) |
| G01R 15/20 | (2006.01) |
| G01K 3/00 | (2006.01) |

(52) U.S. Cl.
CPC ........... *G06N 3/0427* (2013.01); *G01K 3/005* (2013.01); *G01K 13/00* (2013.01); *G01R 15/20* (2013.01); *G01R 19/0092* (2013.01); *G06F 30/18* (2020.01); *G08B 21/182* (2013.01)

(58) Field of Classification Search
CPC ......... G01K 3/005; G01K 13/00; G01R 15/20
See application file for complete search history.

(56) References Cited

U.S. PATENT DOCUMENTS

| | | |
|---|---|---|
| 2015/0211136 A1 | 7/2015 | Boon et al. |
| 2016/0055426 A1* | 2/2016 | Aminzadeh ............ G06N 20/00 706/12 |
| 2016/0092516 A1* | 3/2016 | Poola .................. G06F 16/2379 707/776 |
| 2017/0364043 A1* | 12/2017 | Ganti ..................... G05B 17/02 |
| 2018/0131189 A1* | 5/2018 | Ha ............................ H02J 3/00 |
| 2018/0247215 A1* | 8/2018 | Garvey ................. G06N 5/045 |
| 2018/0254644 A1 | 9/2018 | Cho |
| 2019/0108738 A1 | 4/2019 | Al Hajjaj |

FOREIGN PATENT DOCUMENTS

WO 2014200375 A1 12/2014

OTHER PUBLICATIONS

Drofenik et al., "A Thermal Model of a Forced-Cooled Heat Sink for Transient Temperature Calculations Employing a Circuit Simulator", IEEJ Trans. IA, vol. 126, No. 7, 2006, 11 pages, <https://www.semanticscholar.org/paper/A-Thermal-Model-of-a-Forced-Cooled-Heat-Sink-for-a-Drofenik-Kolar/e2dc3c54e32a21b931a82c05310de6f1f7ace6e8>.

* cited by examiner

*Primary Examiner* — Alvaro E Fortich
(74) *Attorney, Agent, or Firm* — David B. Woycechowsky (57) ABSTRACT

In an approach to fire prediction, a layout and model of an electrical system is created. Data from one or more sensors in the electrical system is received. One or more peak temperatures and one or more steady-state temperatures for the electrical system are calculated based on data from the sensors. Whether at least one of the peak temperatures or steady-state temperatures exceeds a threshold is determined. Responsive to determining that at least one of the peak temperatures or steady-state temperatures exceeds a threshold, an alarm is signaled. The model of the electrical system sensors is recalibrated based on the data from the sensors.

20 Claims, 5 Drawing Sheets

IOT BASED FIRE PREDICTION

BACKGROUND

The present invention relates generally to the field of fire detection systems, and more particularly to Internet of Things (IoT)-based monitoring of concealed wire heating to prevent electrical fires.

The tragic loss of human life, as well as injuries and extensive property damage, from residential electrical fires is overwhelming. Property damage and/or physical and emotional injuries due to electrical fires can be devastating. Every year, electrical fires result in deaths, injuries, and staggering amounts property damage. While some fires are caused by faulty products, many more are caused by the misuse and poor maintenance of electrical equipment, incorrectly installed wiring, overloaded circuits and misapplied extension cords.

Electrical fires can also lead to long-lasting emotional distress. Fires are unpredictable and uncontrollable, and may provide only seconds to get family members to safety.

The Internet of Things refers to the ever-growing network of physical objects that feature an IP address for internet connectivity specifically, or network connectivity generally, and the communication that occurs between these objects and other network-enabled devices and systems. Generally speaking, a sensor is any device that is able to detect changes in an environment. A sensor is able to measure a physical phenomenon (e.g., temperature, electrical current) and transform it into an electronic signal. Sensors enable the IoT to collect data for smarter decisions.

SUMMARY

Embodiments of the present invention disclose a method, a computer program product, and a system for fire prediction. In one embodiment, a layout and model of an electrical system is created. Data from one or more sensors in the electrical system is received. One or more peak temperatures and one or more steady-state temperatures for the electrical system are calculated based on data from the sensors. Whether at least one of the peak temperatures or steady-state temperatures exceeds a threshold is determined. Responsive to determining that at least one of the peak temperatures or steady-state temperatures exceeds a threshold, an alarm is signaled. The model of the electrical system sensors is recalibrated based on the data from the sensors.

DETAILED DESCRIPTION

Electrical fires, leading to loss of life and destruction of property, are common in both commercial and residential settings. Electrical failures or malfunctions are a leading factor in the ignition of fires in homes. Electrical fires originate in cables, which contain one or more electric wires, circuit breakers, and within electrical components. Fires start in electrical panels from overloaded circuits or due to the age of the panel. The panel and circuits become overloaded when the distribution of electricity is inadequate. Occasionally, lighting equipment acts as a source of heat that is too close to easily combustible materials.

Home fires due to electrical failure or malfunction usually involve some form of arcing, which results from an unintentional discharge of electrical current between conductors, such as when the insulation of the electrical cable is damaged or deteriorates due to age. Given sufficient time and current, arc faults can produce enough heat to ignite a fire, especially when the fault occurs near a combustible material, such as the fabric on a piece of furniture. Arc faults are produced by damaged conductors and connectors and may involve damaged wiring, frayed appliance cords, loose connections in wall outlets, or faulty switches and junction boxes.

Short circuits from defective and worn insulation cause a significant number of home fire deaths annually. These can be caused when cords are pinched by doors or furniture or through repetitive flexing. They can also be due to damaged wiring inside walls from nails, screws, or drill bits that puncture insulation during ordinary activities like hanging a picture. Even electrical cords running under carpets can generate enough heat to produce an arc fault.

Circuit breakers are designed to cut the flow of electricity in a circuit in case of excessive current. But these are targeted towards human life safety, to prevent electrocution when a person contacts a live connection, and not towards the risk of fire caused by heat from a faulty or overloaded circuit. An electrical short circuit is often reported to be the cause of fires in buildings, but the mechanism is not always clearly understood. One mechanism by which a short circuit can lead to a fire is through the increased localized heating of the cable, due to a fault in the wiring, causing the casing to melt, leading to a short circuit. But by the time the short circuit has caused the circuit breaker to trip and cut off the electric current, the heating has caused any wood, paper, cloth, fabric, or other combustible material to catch fire. The fault resulting in the heating may be a poor-quality cable; faulty installation of the cable; wire carrying current higher than its rated capacity; bad wire joints; or physical damage to the cable due to friction, a screw or nail, etc. The present invention measures the temporal change in electrical current flow or magnetism (which indicates a change in current flow) which, as the heating commences, reduces the resistance, slowly increasing the current marginally over a period of time. This increase in current flow can be detected by current sensors, such as the IoT sensors incorporated into a circuit breaker or by a nano particle-based magnetic sensor (nano sensor), which senses an increase in magnetism as the wire temperature increases. When the system detects the increased current flow, and determines that the temperature rise is likely to reach the point of ignition of the nearby materials, it signals an alarm.

Other solutions look at detection of smoke due to fire and then trigger alarms. These solutions, however, typically detect the problem after the fire has ignited. The present invention detects the temperature rise as a function of the ignition temperature of combustible items in the room, to report the potential for a fire before it ignites. The invention can also be used by first responders to a fire scene to locate the likely source of ignition to aid in extinguishing the fire. The present invention, therefore, provides for fire prevention, rather than fire detection after a fire has ignited.

Figure 1:
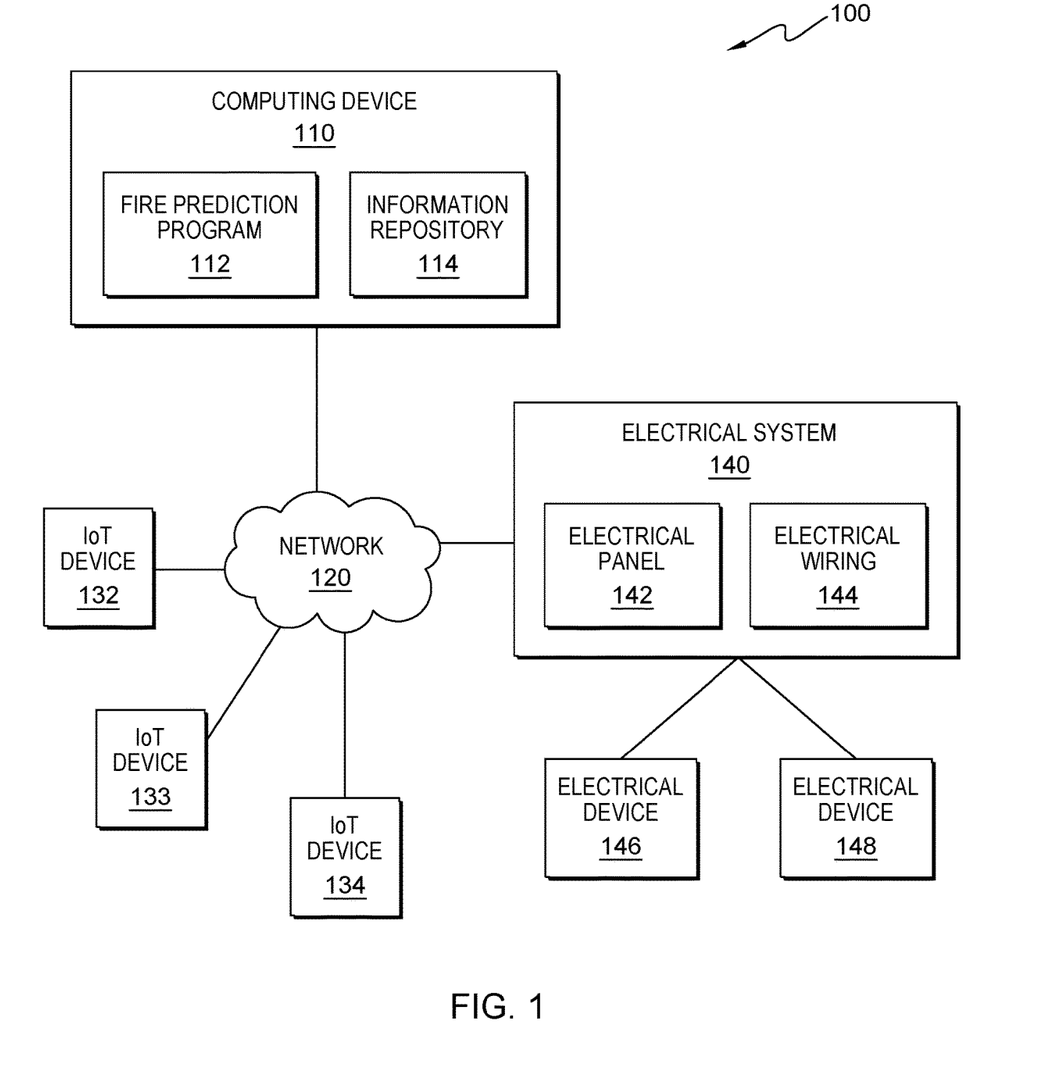
FIG. 1 is a functional block diagram illustrating a distributed data processing environment, in accordance with an embodiment of the present invention.

FIG. 1 is a functional block diagram illustrating a distributed data processing environment, generally designated 100, suitable for operation of fire prediction program 112 in accordance with at least one embodiment of the present invention. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes computing device 110, IoT devices 132, 133, and 134, and electrical system 140, all connected to network 120. Distributed data processing environment 100 also includes electrical devices 146 and 148, which are connected to electrical system 140. Network 120 can be, for example, a telecommunications network, a local area network (LAN), a wide area network (WAN), such as the Internet, or a combination of the three, and can include wired, wireless, or fiber optic connections. Network 120 can include one or more wired and/or wireless networks that are capable of receiving and transmitting data, voice, and/or video signals, including multimedia signals that include voice, data, and video information. In general, network 120 can be any combination of connections and protocols that will support communications between computing device 110, IoT devices 132, 133, and 134, electrical system 140, and other computing devices (not shown) within distributed data processing environment 100.

Computing device 110 can be a standalone computing device, a management server, a web server, a mobile computing device, or any other electronic device or computing system capable of receiving, sending, and processing data. In an embodiment, computing device 110 can be a laptop computer, a tablet computer, a netbook computer, a personal computer (PC), a desktop computer, a personal digital assistant (PDA), a smart phone, or any programmable electronic device capable of communicating with other computing devices (not shown) within distributed data processing environment 100 via network 120. In another embodiment, computing device 110 can represent a server computing system utilizing multiple computers as a server system, such as in a cloud computing environment. In yet another embodiment, computing device 110 represents a computing system utilizing clustered computers and components (e.g., database server computers, application server computers) that act as a single pool of seamless resources when accessed within distributed data processing environment 100.

In an embodiment, computing device 110 includes a neural network computer (NNC), which uses a heat exchange/heat transfer/heat evacuation model to determine equation coefficients for the fire prediction program. The electrical circuit and equipment composition, furniture positions and material used, forced air flow, and other environment parameters for the protected area are identified to enable selection of appropriate thermal plots for definition and initialization of the model. These thermal plots are obtained, for example via a custom web search, from manufacturer specifications for the components, equipment and materials used. When changes are detected in the protected area, the model is redefined. In operation, live temperature feeds from the IoT sensors, for example, IoT devices 132-134, provide the temperature data to the NNC to recompute the heat transfer coefficients as necessary, for example when the measured temperatures are not in the range of the base temperature plots. The NNC then runs until the error of the equations describing the model is reduced below a pre-determined threshold. In an embodiment, the pre-determined threshold is a system default. In another embodiment, the pre-determined threshold is received from a user during system configuration. In an embodiment, the NNC may be internal to computing device 110. In another embodiment, the NNC may be external to computing device 110, and may be accessed by computing device 110 over network 120. In yet another embodiment, the NNC may be an application specific integrated circuit (ASIC) composed of neural network circuits.

In an embodiment, computing device 110 includes a continuous simulator engine (CSE). The CSE is the simulation engine that is triggered every time there is a change in either the current pattern or in the temperature conditions measured by the IoT sensors. The CSE uses numerical simulation methods, for example, the 4th-Order Runge Kutta Method (RK4), to solve partial differential equations to compute the peak and stable temperatures. The CSE uses the heat exchange models created in the fire prediction program for the electrical circuits and measures the peak and steady state current changes as devices are switched on or off in the electrical circuit. The computation engine in the CSE is run whenever the sensor inputs change, and recomputes both the peak temperatures and the steady state temperatures for the different points of the circuits based on the current profile and the temperature readings. In an embodiment, the CSE may be internal to computing device 110. In another embodiment, the CSE may be external to computing device 110, and may be accessed by computing device 110 over network 120. In yet another embodiment, the CSE may be an ASIC, either internal or external to computing device 110.

In an embodiment, computing device 110 includes fire prediction program 112. In an embodiment, fire prediction program 112 is a program, application, or subprogram of a larger program for IoT based monitoring of concealed wire heating to prevent electrical fires. In an alternative embodiment, fire prediction program 112 may be located on any other device accessible by computing device 110 via network 120.

In an embodiment, computing device 110 includes information repository 114. In an embodiment, information repository 114 may be managed by fire prediction program 112. In an alternate embodiment, information repository 114 may be managed by the operating system of the device, alone, or together with, fire prediction program 112. Information repository 114 is a data repository that can store, gather, compare, and/or combine information. In some embodiments, information repository 114 is located externally to computing device 110 and accessed through a communication network, such as network 120. In some embodiments, information repository 114 is stored on computing device 110. In some embodiments, information repository 114 may reside on another computing device (not shown), provided that information repository 114 is accessible by computing device 110. Information repository 114 includes, but is not limited to, temperature plots data for different electrical components and equipment, temperature plots for furniture and furnishing material, heat transfer and evacuation data of temperature and humidity control devices, user data, room or area data, simulation model data, neural network models data, system configuration data, and other data that is received by fire prediction program 112 from one or more sources, and data that is created by fire prediction program 112.

Information repository 114 may be implemented using any volatile or non-volatile storage media for storing information, as known in the art. For example, information repository 114 may be implemented with a tape library, optical library, one or more independent hard disk drives, multiple hard disk drives in a redundant array of independent disks (RAID), solid-state drives (SSD), or random-access memory (RAM). Similarly, the information repository 114 may be implemented with any suitable storage architecture known in the art, such as a relational database, an object-oriented database, or one or more tables.

Distributed data processing environment 100 includes the IoT devices 132, 133, and 134. In an embodiment, IoT devices 132, 133, and 134 are sensors that connect to each other and to computing device 110 over network 120. In an embodiment, IoT devices 132, 133, and 134 may connect via a wired network connection. In another embodiment, IoT devices 132, 133, and 134 may connect via a wireless network connection. In yet another embodiment, IoT devices 132, 133, and 134 may connect via any method that is appropriate for connecting sensors as would be known to those skilled in the art.

In an embodiment, IoT devices 132, 133, and 134 may be temperature sensors that measure the temperature of objects in the room where they are located, to detect both ambient and temporal temperatures that are used by fire prediction program 112. In another embodiment, IoT devices 132, 133, and 134 may be current sensors that measure the electrical current flowing through the various electrical circuits in the room where they are located. In yet another embodiment, IoT devices 132, 133, and 134 may be nano sensors that measure the electrical current flowing through the various electrical circuits in the room, by detecting minute changes in magnetic fields caused by changes in electrical current flow. In an embodiment, IoT devices 132, 133, and 134 may be any combination of temperature, current, or nano sensors. In some embodiments, IoT devices 132, 133, and 134 may be stand-alone devices. In other embodiments, IoT devices 132, 133, and 134 may be incorporated into switch boards that include switches or receptacles for distribution of the electrical current in the room. In an embodiment, distributed data processing environment 100 may include any number of IoT devices 132, 133, and 134.

In an embodiment, the live temperature feeds from the IoT heat sensors are connected to the system via network 120 and provide the temperature data to the NNC to recompute the heat transfer coefficients as necessary.

In an embodiment, the second set of sensors are the power change sensors that are embedded in either circuit breakers or are connected in the circuit provide the dynamic current profile measurements and time values as it changes due to the power change in the power circuits.

Distributed data processing environment 100 includes electrical system 140. Electrical system 140 includes electrical panel 142 and electrical wiring 144. Electrical system 140 represents the distribution of electrical power throughout a room or area. In an embodiment, electrical system 140 may include any number of electrical panels 142, electrical wiring 144, or other components as one of skill in the art would recognize as comprising an electrical distribution system.

Electrical system 140 includes electrical devices 146 and 148 connected to electrical system 140 to draw electric current to power electrical devices 146 and 148. In an embodiment, electrical devices 146 and 148 represent any electrical devices that might be found in the room or area. For example, electrical device 146 may be a washing machine, and electrical device 148 may be a microwave oven. In an embodiment, electrical system 140 may include any number of electrical devices 146 and 148.

Figure 2:
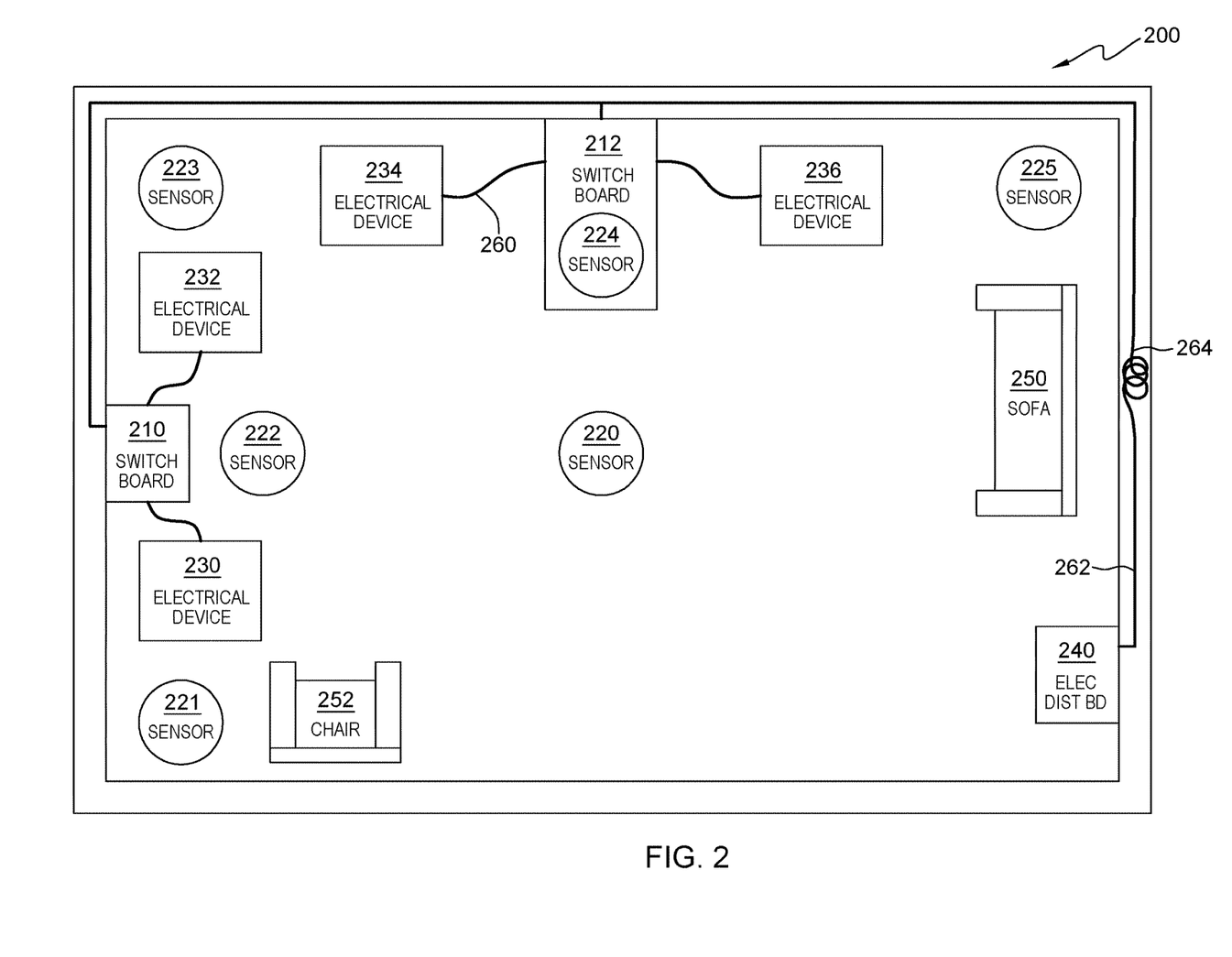
FIG. 2 illustrates an example of a room in a house with the IoT based system to identify concealed wire heating to predict and reduce electrical fires installed, in accordance with an embodiment of the present invention.

FIG. 2 is an example of a facility, generally designated 200, which is monitored by fire prediction program 112, in accordance with at least one embodiment of the present invention. Facility 200 includes switch boards 210 and 212. In an embodiment, switch boards 210 and 212 contain electrical receptacles for electrical power distribution. In an embodiment, switch board 212 contains sensor 224. Sensor 224 monitors, for example, the temperature in the receptacle, the current flow through the receptacle, or both. In an embodiment, facility 200 may contain any number of switch boards 210 and 212.

Facility 200 includes sensors 220, 221, 222, 223, and 225, in addition to sensor 224. Sensors 220, 221, 222, 223, and 225 monitor the temperature of the facility, and may be configured to measure the temperature of specific items in the facility, such as the electrical receptacles or other devices. Facility 200 also includes electrical devices 230, 232, 234, and 236. Electrical device 230, 232, 234, and 236 represent any devices found in facility 200 that draw electrical current from the electrical system. Electrical device 234 includes power cord 260, which connects electrical device 234 to the electrical system via switch board 212.

Electrical device 230, 232, 234, and 236 may be, for example, a washing machine, a microwave oven, a television, or any other device that draws electrical current from the electrical system in facility 200.

Facility 200 also includes sofa 250 and chair 252, which represent furniture that might be found in facility 200, and which might be constructed of potentially combustible materials. Facility 200 includes components of the electrical system, including electrical distribution board 240 and electrical cable 262. Electrical cable 262, in this example, includes coil 264, which represents an extra coil of electrical cable 262 left in place during installation. Coil 264 is an example of a fault that could cause electrical cable 262 to generate heat that leads to ignition of nearby combustible materials, for example, the fabric of sofa 250.

In an example of one possible embodiment of the invention, fire prediction program 112 reads the instantaneous current level and temporal current change from a plateau for each circuit breaker in electrical distribution board 240. Fire prediction program 112 also obtains the ambient temperature in the different parts of the room from heat sensors embedded in either the walls, furniture, or conduits, for example, IoT sensors 220-225. For each wiring circuit, the presence of any bends, joins, junctions, or plugs are identified, and the surrounding material type and heat transfer model for that material type are selected for the computation. When current flows in the circuit breaker, the CSE runs these models computing the potential ignition points, and whether there is potential for a fire igniting through localized heating at these points. If the ignition points are reached in the computation, and are corroborated by temperature variations obtained from the sensors, then an alarm is triggered, and the likely location of the ignition points is transmitted with the alarm.

In a further example, the wiring is clean from the circuit breaker to the receptacle, but at the receptacle the connection to the electrical plug causes heating when a high-power device, such as a washing machine, is connected. If there is some woodwork enclosing the plug point that has a surface connection to the board, due to some anomalous condition such as a high current draw, the plug starts heating, and therefore the woodwork also starts heating. The woodwork will continue to heat until it reaches its fire ignition point. However, the heat transfer models for this circuit has definitions of the plug, the panel cover, and the woodwork, and their heat transfer models. When the current flow is relatively constant, but there is a small variation due to the increasing temperature at this plug, the heat transfer model will show that the woodwork is reaching its ignition point and will trigger an alarm, as well as shutting down the power in the circuit. This prevents a fire being ignited.

Another example is where there is a wire junction in a junction box where the wire also has a bend, and there is some furniture with a fabric covering that is very close to, or is in surface contact with, the junction box. If the circuit has a high current flow for a period of time, then the junction box could heat up and transfer the heat to the fabric. Over a period of time, the fabric would heat enough for a fire to be ignited. But with the present invention, as the temporal current measurement and ambient conditions are received from the sensors, if fire prediction program 112 calculates that the ignition point will be reached, the alarm is triggered and the current to the circuit is shut off.

Figure 3:
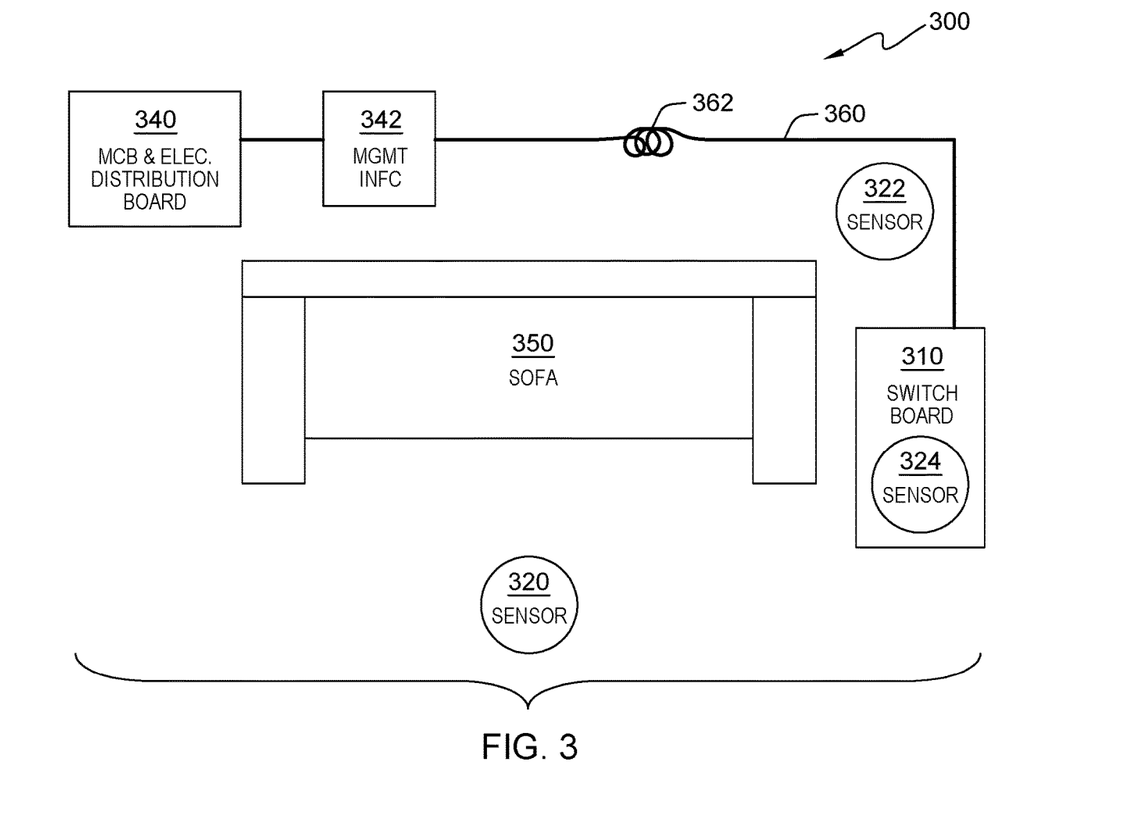
FIG. 3 is a close-up illustration of part of the example room of FIG. 2 in a house with the IoT-based system installed to predict electrical fires, in accordance with an embodiment of the present invention.

FIG. 3 is an example of a detail section of facility 200, generally designated 300, which is monitored by fire prediction program 112, in accordance with at least one embodiment of the present invention. Section 300 includes switch board 310 with sensor 324 incorporated into switch board 310; sensors 320 and 322; miniature circuit breaker and electrical distribution board 340; management interface 342; sofa 350; and electrical cable 360, which includes coil 362.

In an example of one possible embodiment of the invention, the section shown in FIG. 3 contains some residual cable length that was coiled and left in the conduit in the wall, as shown in the figure as coil 362. This could be a potential location of temperature increase, but since the temperature sensors are not lined parallel to the complete wiring, they may not detect the temperature rise in the wire. Therefore, nano magnetic sensors embedded in the jacket around the wire sense the current flow and provide the information that the current is gradually changing. This is compared to the model by fire prediction program 112. If the rate the current is changing is sufficient to indicate the potential melting of the wire insulation, then fire prediction program 112 signals an alarm. If the rate the current is changing is not sufficient to indicate the potential melting of the wire insulation, then fire prediction program 112 recalibrates the model for the for the circuit to accommodate the anomalous practical conditions.

Figure 4:
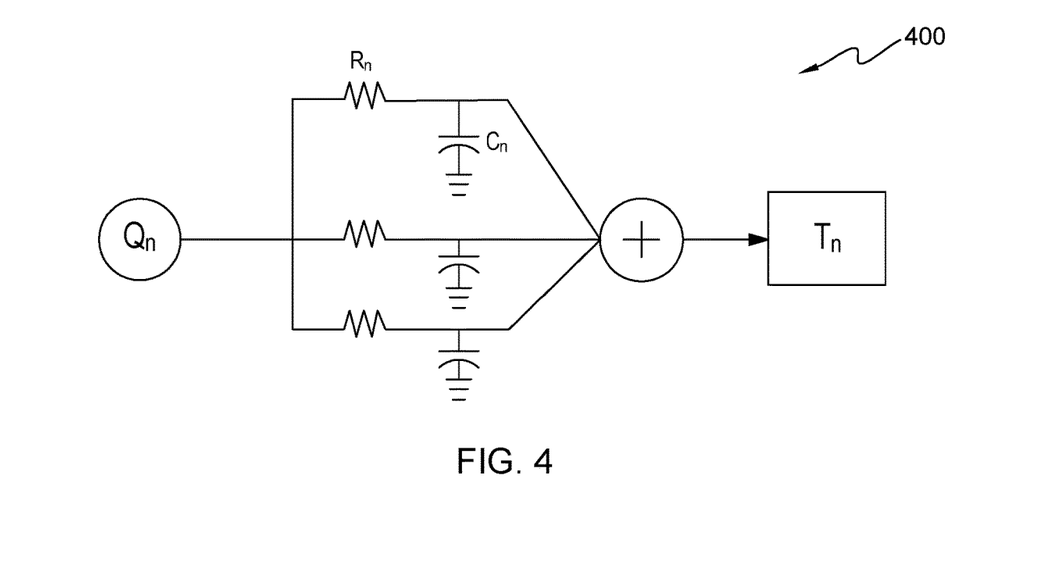
FIG. 4 is an example of the model of the electrical circuit in the room used by the fire prediction program to calculate the expected temperature at each point of the electrical circuit, in accordance with an embodiment of the present invention.

FIG. 4 is an example of a simulation model, generally designated 400, used by fire prediction program 112 to predict the temperature of the electrical circuit. In this example, the RK4 equations model the thermal equivalence resistance/capacitance (RC) networks representing the thermal model of the electrical circuits connected in parallel in the room or area (see Equation 1), also known as a parallel connection resistor-capacitor model. A typical RC network is chosen rather than a pure resistance network because dynamic current variations could be the final trigger of the alarm, and the RC network better simulates the dynamic temperature of different materials and surfaces. This parallel circuit accurately models the dynamic simulation because the circuits in parallel more closely match the thermal dynamics of real circuits. The equations represent a typical matrix equation from the plots of the heat exchange curve of the change in temperature, delta $T_m$, which is the product of the impedance, $z_{mn}$, times the current in the circuit, $Q_n$, where m and n typically range from 1 to 3. The impedances are dependent values based on the temperature as it is read from the temperature plot created in fire prediction program 112.

$$\Delta T_1 = z_{11}*Q_1 + z_{12}*Q_2 + z_{13}*Q_3$$

$$\Delta T_2 = z_{21}*Q_1 + z_{22}*Q_2 + z_{23}*Q_3$$

$$\Delta T_3 = z_{31}*Q_1 + z_{32}*Q_{23} + z_{33}*Q_3 \quad \text{(Equation 1)}$$

where T=temperature, Q=current in the circuit, z=impedance in the circuit (a function of RC), R=resistance, and C=capacitance.

Figure 5:
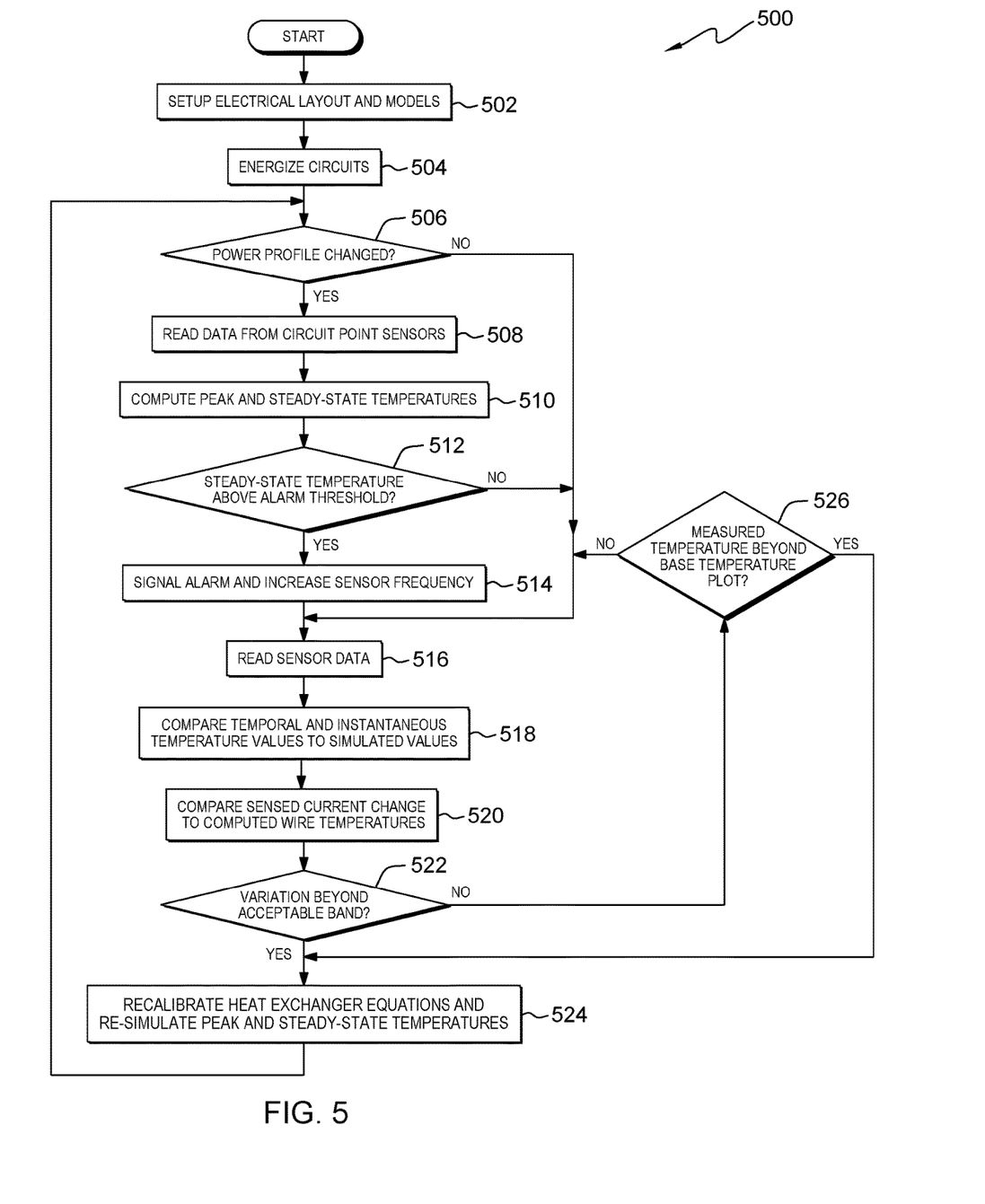
FIG. 5 is a flowchart depicting operational steps of the fire prediction program, on a computing device within the distributed data processing environment of FIG. 1, for identifying concealed wire heating to predict and reduce electrical fires, in accordance with an embodiment of the present invention.

FIG. 5 is a flow chart diagram of workflow 500 depicting operational steps for fire prediction program 112 for IoT based monitoring of concealed wire heating to prevent electrical fires. In an alternative embodiment, the steps of workflow 500 may be performed by any other program while working with fire prediction program 112. In an embodiment, fire prediction program 112 sets up the electrical layout and models. In an embodiment, fire prediction program 112 energizes the circuits in the electrical system. In an embodiment, fire prediction program 112 determines if the power profile has changed. In an embodiment, if fire prediction program 112 determines that the power profile has changed, then fire prediction program 112 reads data from the circuit point sensors. In an embodiment, fire prediction program 112 computes peak and steady-state temperatures. In an embodiment, fire prediction program 112 determines if the steady-state temperature is above an alarm threshold. In an embodiment, if fire prediction program 112 determines that the steady-state temperature is above an alarm threshold, then fire prediction program 112 signals an alarm and increases the sensor frequency. In an embodiment, fire prediction program 112 reads the sensor data. In an embodiment, fire prediction program 112 compares the temporal and instantaneous temperature values to the simulated values. In an embodiment, fire prediction program 112 compares the sensed current change to the computed wire temperatures. In an embodiment, fire prediction program 112 determines if the variation is beyond the acceptable band. In an embodiment, if fire prediction program 112 determines that the variation is beyond the acceptable band, then fire prediction program 112 recalibrates the heat exchanger equations and re-simulates the peak and steady-state temperature. In an embodiment, fire prediction program 112 determines if the measured temperature is beyond the base temperature plot.

It should be appreciated that embodiments of the present invention provide at least for IoT based monitoring of concealed wire heating to prevent electrical fires. However, FIG. 5 provides only an illustration of one implementation and does not imply any limitations with regard to the environments in which different embodiments may be implemented. Many modifications to the depicted environment may be made by those skilled in the art without departing from the scope of the invention as recited by the claims.

Fire prediction program 112 sets up the electrical layout and models (step 502). In an embodiment, fire prediction program 112 establishes the electrical layout of the room or area being monitored. This includes, for example, establishing the wiring circuits, including all bends, joints, and coiling of the wire or cable; the types and locations of the switch boards, (e.g., switch boards with electrical receptacle or switch boards with light switches); and the types and locations of junction boxes. In an embodiment, fire prediction program 112 imports the electrical layout from another application, for example, an architectural application used to design the electrical system.

In an embodiment, fire prediction program 112 builds the models for the electrical layout. In an embodiment, fire prediction program 112 builds the heat exchange equation models for the metal (e.g., the wire itself, metal enclosures, metal furnishings), insulator (e.g., wire insulation, insulation in the wall cavities, insulation in electrical boxes), wall (e.g., wallboard, wooden or metal studs, insulation), furnishings in the room that are constructed from potentially combustible materials, and any other materials that are in contact with, or close to, the electrical circuits, where excess heat from an electrical fault may lead to ignition of the materials. In an embodiment, fire prediction program 112 constructs profiles of the electrical equipment and furnishings in the room or area being monitored to be used to calculate potential sources of ignition.

In an embodiment, fire prediction program 112 calculates heat exchange graphs or curves for the various materials in the electrical system, for example, the wire insulation or jacket, the fabric coverings for the furniture, or construction materials, such as the wallboard, studs, or woodworking. In an embodiment, fire prediction program 112 calculates the wire temperatures the various wire segments in the electrical system.

In an embodiment, fire prediction program 112 conducts a custom web search to locate the specifications on materials in the room or area. For example, fire prediction program 112 conducts a custom web search to locate the specifications on the specific wire used in the electrical layout, or the specific fabric used on furniture in the room or area, to determine the ignition temperature of the wire insulation or the fabric.

In an embodiment, fire prediction program 112 connects to all the IoT sensors in the room or area, for example, IoT devices 132, 133, and 134 from FIG. 1, or sensors 220-225 from FIG. 3. In an embodiment, fire prediction program 112 connects to any IoT sensors that are available in the room or area, for example, facility 200 of FIG. 2, that can be used to measure heat or electrical current to monitor concealed wire heating to prevent electrical fires.

Fire prediction program 112 energizes the circuits (step 504). In an embodiment, fire prediction program 112 energizes the circuits in the electrical system by activating circuit breakers in an electrical panel, such as electrical panel 142 in FIG. 1. In another embodiment, fire prediction program 112 energizes the circuits in the electrical system by activating miniature circuit breakers in a miniature circuit breaker and electrical distribution board 340 as shown in FIG. 3.

Fire prediction program 112 determines if the power profile changed (decision block 506). In an embodiment, if fire prediction program 112 determines that the power profile has not changed ("no" branch, decision block 506), then fire prediction program 112 proceeds to step 516.

Fire prediction program 112 reads data from the circuit point sensors (step 508). If fire prediction program 112 determines the power profile has changed ("yes" branch, decision block 506), then fire prediction program 112 reads the data, including ambient temperature, point temperature, and electrical current flow, from the IoT sensors distributed in the room or area.

Fire prediction program 112 computes the peak and steady-state temperatures (step 510). At step 510, fire prediction program 112 uses the CSE to compute the peak and steady-state temperatures for the entire electrical system using the ambient temperature, point temperature, and electrical current flow from the IoT sensors distributed in the room or area. With the applicable z values from equation 1 above, and the ambient temperature conditions, the potential peak temperatures are computed by the CSE for each of the potential ignition points in the room or area.

Fire prediction program 112 determines if the steady-state temperatures are above the alarm threshold (decision block 512). At decision block 512, fire prediction program 112 compares the steady-state temperatures calculated in step 510 to the threshold temperatures calculated in step 510. If fire prediction program 112 determines that the steady-state temperatures are not above the alarm threshold ("no" branch, decision block 512), then fire prediction program 112 proceeds to step 516.

Fire prediction program 112 signals an alarm and increases the sensor frequency (step 514). In an embodiment, if fire prediction program 112 determines that the steady-state temperatures are above the alarm threshold ("yes" branch, decision block 512), then fire prediction program 112 signals an alarm that a fire may ignite. In an embodiment, fire prediction program 112 increases the sampling frequency of the IoT sensors in the room or area, to decrease the time between sampling, thereby allowing fire prediction program 112 to more accurately track any changes in temperature or current. If the periodic ambient temperature conditions do not show any anomaly either with a rate of change or the absolute value, then the IoT sensor data rate is left unchanged, and fire prediction program 112 proceeds to step 516.

In an embodiment, fire prediction program 112 transmits the data to an augmented reality or virtual reality model used by emergency workers to provide them with the probable ignition points as a prioritized based on the likelihood of fire as determined by the computation in step 510 to allow the emergency workers to address prioritize their response and avoid secondary fires.

Fire prediction program 112 reads the sensor data (step 516). In an embodiment, fire prediction program 112 reads the data, including ambient temperature, point temperature, and electrical current flow, from the IoT sensors distributed in the room or area.

Fire prediction program 112 compares the temporal and instantaneous temperature values to the simulated values (step 518). At step 508, fire prediction program 112 compares the temporal and instantaneous temperature values to the values calculated from the simulation models in step 502.

Fire prediction program 112 compares the sensed current change to the computed wire temperatures (step 520). At step 510, fire prediction program 112 compares the calculated temperatures based on the sensed current change to the wire temperatures computed in step 502. The temporal temperature is matched to the simulated value to validate the model and, in case of discrepancies, the model is recalibrated by calling the CNN module with the new data points. For example, a loop of the cable left during installation of the wiring can cause local heating of the wire. The model is then compensated when the usage shows that the heat build-up and exchange are different from the plots as originally computed in step 502.

Fire prediction program 112 determines if the variation is beyond the acceptable band (decision block 522). At decision block 512, fire prediction program 112 determines if the variation between the calculated temperatures based on the sensed current change and the wire temperatures computed in step 502 is beyond the acceptable band as established in step 502. If fire prediction program 112 determines that the variation between the calculated temperatures based on the sensed current change and the wire temperatures computed in step 502 is not beyond the acceptable band ("no" branch, decision block 522), then fire prediction program 112 proceeds to decision block 526.

Fire prediction program 112 recalibrates the heat exchanger equations and re-simulates the peak and steady-state temperatures (step 524). In an embodiment, if fire prediction program 112 determines that the variation is beyond the acceptable band ("yes" branch, decision block 522), then fire prediction program 112 uses the NNC to recalibrate the heat exchanger equations and uses the CSE to re-simulate the peak and steady-state temperatures based on the actual temperatures and currents measured in decision block 526. Fire prediction program 112 then returns to decision block 506.

Fire prediction program 112 determines if the measured temperature is beyond the base temperature plot (decision block 526). In an embodiment, fire prediction program 112 determines if the temperature measured from the IoT sensors in decision block 526 is beyond the base temperature plot as calculated in step 502. If fire prediction program 112 determines that the temperature measured from the IoT sensors in decision block 526 is beyond the base temperature plot as calculated in step 502 ("yes" branch, decision block 526), then fire prediction program 112 proceeds to step 524 to recalibrate the heat exchanger equations. If fire prediction program 112 determines that the temperature measured from the IoT sensors in decision block 526 is not beyond the base temperature plot as calculated in step 510 ("no" branch, decision block 526), then fire prediction program 112 returns to step 516 to continue to monitor the IoT sensor data.

Figure 6:
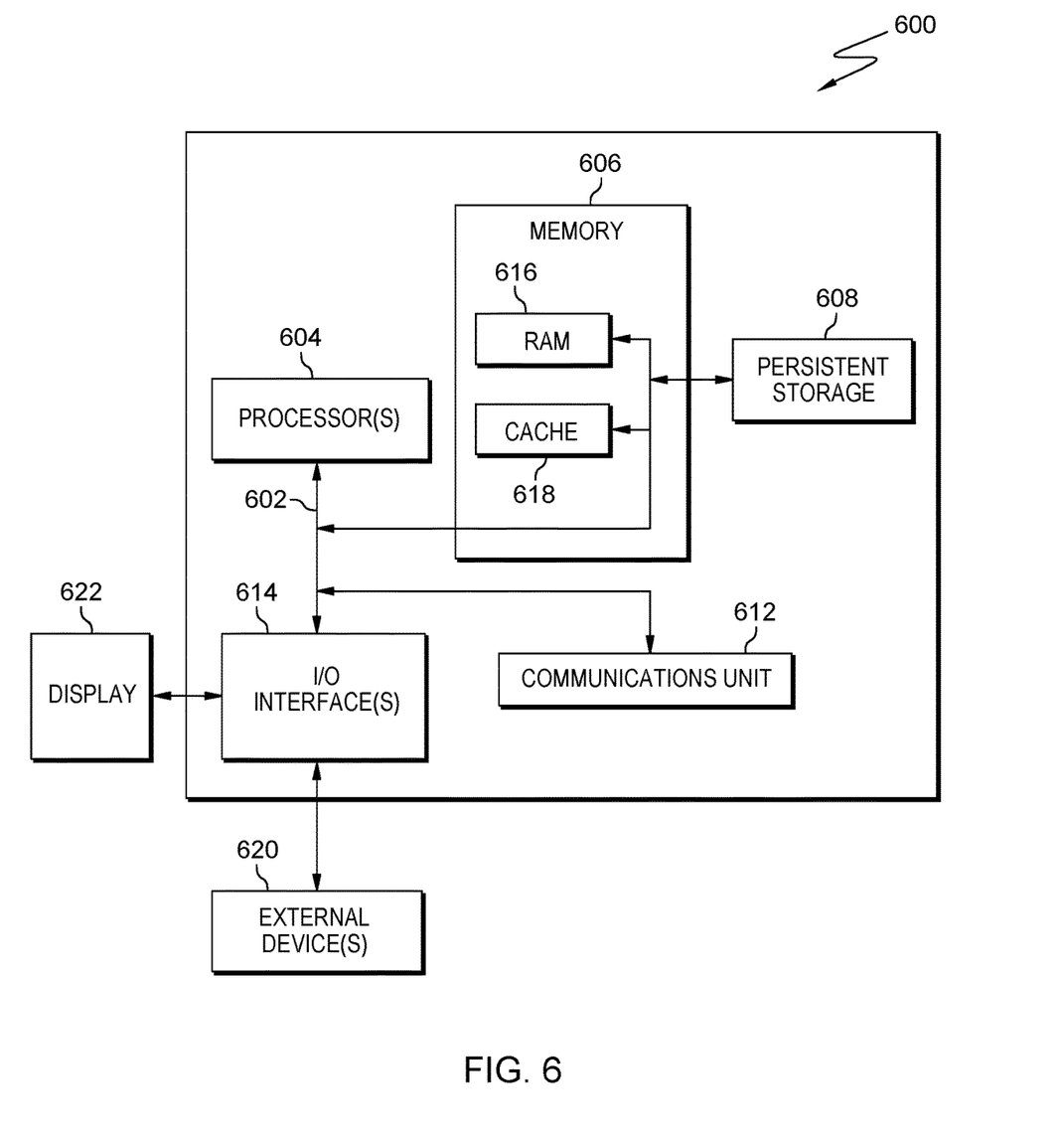
FIG. 6 depicts a block diagram of components of the computing devices executing the fire prediction program within the distributed data processing environment of FIG. 1, in accordance with an embodiment of the present invention.

FIG. 6 is a block diagram depicting components of computing device 110 suitable for fire prediction program 112, in accordance with at least one embodiment of the invention. FIG. 6 displays the computer 600, one or more processor(s) 604 (including one or more computer processors), a communications fabric 602, a memory 606 including, a random-access memory (RAM) 616, and a cache 618, a persistent storage 608, a communications unit 612, I/O interfaces 614, a display 622, and external devices 620. It should be appreciated that FIG. 6 provides only an illustration of one embodiment and does not imply any limitations with regard to the environments in which different embodiments may be implemented. Many modifications to the depicted environment may be made.

As depicted, the computer 600 operates over the communications fabric 602, which provides communications between the computer processor(s) 604, memory 606, persistent storage 608, communications unit 612, and input/output (I/O) interface(s) 614. The communications fabric 602 may be implemented with an architecture suitable for passing data or control information between the processors 604 (e.g., microprocessors, communications processors, and network processors), the memory 606, the external devices 620, and any other hardware components within a system. For example, the communications fabric 602 may be implemented with one or more buses.

The memory 606 and persistent storage 608 are computer readable storage media. In the depicted embodiment, the memory 606 comprises a RAM 616 and a cache 618. In general, the memory 606 can include any suitable volatile or non-volatile computer readable storage media. Cache 618 is a fast memory that enhances the performance of processor(s) 604 by holding recently accessed data, and near recently accessed data, from RAM 616.

Program instructions for fire prediction program 112 may be stored in the persistent storage 608, or more generally, any computer readable storage media, for execution by one or more of the respective computer processors 604 via one or more memories of the memory 606. The persistent storage 608 may be a magnetic hard disk drive, a solid-state disk drive, a semiconductor storage device, read only memory (ROM), electronically erasable programmable read-only memory (EEPROM), flash memory, or any other computer readable storage media that is capable of storing program instruction or digital information.

The media used by persistent storage 608 may also be removable. For example, a removable hard drive may be used for persistent storage 608. Other examples include optical and magnetic disks, thumb drives, and smart cards that are inserted into a drive for transfer onto another computer readable storage medium that is also part of persistent storage 608.

The communications unit 612, in these examples, provides for communications with other data processing systems or devices. In these examples, the communications unit 612 includes one or more network interface cards. The communications unit 612 may provide communications through the use of either or both physical and wireless communications links. In the context of some embodiments of the present invention, the source of the various input data may be physically remote to the computer 600 such that the input data may be received, and the output similarly transmitted via the communications unit 612.

The I/O interface(s) 614 allows for input and output of data with other devices that may be connected to computer 600. For example, the I/O interface(s) 614 may provide a connection to external device(s) 620 such as a keyboard, a keypad, a touch screen, a microphone, a digital camera, and/or some other suitable input device. External device(s) 620 can also include portable computer readable storage media such as, for example, thumb drives, portable optical or magnetic disks, and memory cards. Software and data used to practice embodiments of the present invention, e.g., fire prediction program 112, can be stored on such portable computer readable storage media and can be loaded onto persistent storage 608 via the I/O interface(s) 614. I/O interface(s) 614 also connect to a display 622.

Display 622 provides a mechanism to display data to a user and may be, for example, a computer monitor. Display 622 can also function as a touchscreen, such as a display of a tablet computer.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for fire prediction, the computer-implemented method comprising:
   creating, by one or more computer processors, a model of an electrical system for an area, wherein the model of the electrical system for the area includes a layout of the electrical system and a heat transfer model of one or more segments of an electric cable in the electrical system;
   receiving, by the one or more computer processors, a data from one or more sensors in the electrical system, wherein the data includes at least one of a temperature data and a current flow data;
   calculating, by the one or more computer processors, one or more peak temperatures and one or more steady-state temperatures for the electrical system, wherein the one or more peak temperatures and one or more steady-state temperatures are calculated based on at least one of the temperature data and the current flow data from the one or more sensors;
   determining, by the one or more computer processors, whether at least one of the one or more peak temperatures and the one or more steady-state temperatures exceeds a threshold;
   responsive to the at least one of the one or more peak temperatures and the one or more steady-state temperatures exceeds the threshold, signaling, by the one or more computer processors, an alarm; and
   recalibrating, by the one or more computer processors, the model of the electrical system for the area based on the data from the one or more sensors.

2. The computer-implemented method of claim 1 wherein determining whether at least one of the one or more peak temperatures and the one or more steady-state temperatures exceeds the threshold further comprises:
   calculating, by the one or more computer processors, one or more temporal variations of a steady state current based on the data from the one or more sensors in the electrical system, wherein the one or more sensors are nano particle-based magnetic sensors; and
   predicting, by the one or more computer processors, whether one or more points within the electrical system will exceed the threshold based on the one or more temporal variations of the steady state current.

3. The computer-implemented method of claim 1, wherein the sensors include one or more point sensors incorporated into one or more switch and junction boxes and one or more area sensors distributed throughout the area.

4. The computer-implemented method of claim 1, wherein creating a layout and model of an electrical system further comprises using a parallel connection resistor-capacitor model.

5. The computer-implemented method of claim 1, wherein creating, by the one or more computer processors, a layout and model of an electrical system further comprises using a neural network computer to dynamically calculate the heat transfer model for the electrical system based on comparing a simulated temperature to an actual temperature.

6. The computer-implemented method of claim 1, wherein calculating the one or more peak temperatures and the one or more steady-state temperatures for the electrical system further comprises calculating, by the one or more computer processors, a 4th-Order Runge Kutta Method to solve partial differential equations to compute the one or more peak temperature and the one or more steady-state temperatures for the electrical system.

7. The computer-implemented method of claim 1, wherein signaling the alarm further comprises transmitting, by the one or more computer processors, an alarm data to an augmented reality model used by an emergency workers to provide the emergency workers with one or more probable ignition points as a prioritized list based on the one or more peak temperatures and the one or more steady-state temperatures.

8. A computer program product for fire prediction, the computer program product comprising one or more computer readable storage media and program instructions stored on the one or more computer readable storage media, the program instructions including instructions to:
   create a model of an electrical system for an area, wherein the model of the electrical system for the area includes a layout of the electrical system and a heat transfer model of one or more segments of an electric cable in the electrical system;
   receive a data from one or more sensors in the electrical system, wherein the data includes at least one of a temperature data and a current flow data;
   calculate one or more peak temperatures and one or more steady-state temperatures for the electrical system, wherein the one or more peak temperatures and one or more steady-state temperatures are calculated based on at least one of the temperature data and the current flow data from the one or more sensors;
   determine whether at least one of the one or more peak temperatures and the one or more steady-state temperatures exceeds a threshold;
   responsive to the at least one of the one or more peak temperatures and the one or more steady-state temperatures exceeds the threshold, signal an alarm; and
   recalibrate the model of the electrical system for the area based on the data from the one or more sensors.

9. The computer program product of claim 8, wherein determining whether at least one of the one or more peak temperatures and the one or more steady-state temperatures exceeds the threshold further comprises:
   calculating one or more temporal variations of a steady state current based on the data from the one or more sensors in the electrical system, wherein the one or more sensors are nano particle-based magnetic sensors; and
   predicting whether one or more points within the electrical system will exceed the threshold based on the one or more temporal variations of the steady state current.

10. The computer program product of claim 8, wherein the sensors include one or more point sensors incorporated into one or more switch and junction boxes and one or more area sensors distributed throughout the area.

11. The computer program product of claim 8, wherein creating a layout and model of an electrical system further comprises using a parallel connection resistor-capacitor model.

12. The computer program product of claim 8, wherein creating a layout and model of an electrical system further comprises using a neural network computer to dynamically calculate the heat transfer model for the electrical system based on comparing a simulated temperature to an actual temperature.

13. The computer program product of claim 8, wherein calculating the one or more peak temperatures and the one or more steady-state temperatures for the electrical system further comprises calculating a 4th-Order Runge Kutta Method to solve one or more partial differential equations to compute the one or more peak temperature and the one or more steady-state temperatures for the electrical system.

14. The computer program product of claim 8, wherein signaling the alarm further comprises transmitting an alarm data to an augmented reality model used by an emergency workers to provide the emergency workers with one or more probable ignition points as a prioritized list based on the one or more peak temperatures and the one or more steady-state temperatures.

15. A computer system for fire prediction, the computer system comprising:
    one or more computer processors;
    one or more computer readable storage media; and
    program instructions stored on the one or more computer readable storage media for execution by at least one of the one or more computer processors, the stored program instructions including instructions to:
    create a model of an electrical system for an area, wherein the model of the electrical system for the area includes a layout of the electrical system and a heat transfer model of one or more segments of an electric cable in the electrical system;
    receive a data from one or more sensors in the electrical system, wherein the data includes at least one of a temperature data and a current flow data;
    calculate one or more peak temperatures and one or more steady-state temperatures for the electrical system, wherein the one or more peak temperatures and one or more steady-state temperatures are calculated based on at least one of the temperature data and the current flow data from the one or more sensors;
    determine whether at least one of the one or more peak temperatures and the one or more steady-state temperatures exceeds a threshold;
    responsive to the at least one of the one or more peak temperatures and the one or more steady-state temperatures exceeds the threshold, signal an alarm; and
    recalibrate the model of the electrical system for the area based on the data from the one or more sensors.

16. The computer system of claim 15, wherein determining whether at least one of the one or more peak temperatures and the one or more steady-state temperatures exceeds the threshold further comprises:
    calculating one or more temporal variations of a steady state current based on the data from the one or more sensors in the electrical system, wherein the one or more sensors are nano particle-based magnetic sensors; and
    predicting whether one or more points within the electrical system will exceed the threshold based on the one or more temporal variations of the steady state current.

17. The computer system of claim 15, wherein the sensors include one or more point sensors incorporated into one or more switch and junction boxes and one or more area sensors distributed throughout the area.

18. The computer system of claim 15, wherein creating a layout and model of an electrical system further comprises using a parallel connection resistor-capacitor model.

19. The computer system of claim 15, wherein creating a layout and model of an electrical system further comprises using a neural network computer to dynamically calculate the heat transfer model for the electrical system based on comparing a simulated temperature to an actual temperature.

20. The computer system of claim 15, wherein calculating the one or more peak temperatures and the one or more steady-state temperatures for the electrical system further comprises calculating a 4th-Order Runge Kutta Method to solve one or more partial differential equations to compute the one or more peak temperature and the one or more steady-state temperatures for the electrical system.

* * * * *